United States Patent [19]

Kawabe et al.

[11] Patent Number: 5,324,619
[45] Date of Patent: Jun. 28, 1994

[54] POSITIVE QUINONE DIAZIDE PHOTORESIST COMPOSITION CONTAINING SELECT POLYHYDROXY ADDITIVE

[75] Inventors: Yasumasa Kawabe; Kazuya Uenishi; Tadayoshi Kokubo, all of Shizuoka, Japan

[73] Assignee: Fuji Photo Film Co., Ltd., Kanagawa, Japan

[21] Appl. No.: 857,497

[22] Filed: Mar. 25, 1992

[30] Foreign Application Priority Data

Mar. 26, 1991 [JP] Japan .................................. 3-62150

[51] Int. Cl.$^5$ .......................... G03F 7/023; G03C 1/61
[52] U.S. Cl. ..................................... 430/191; 430/165; 430/192; 430/512
[58] Field of Search ............... 430/191, 192, 512, 924, 430/165

[56] References Cited

U.S. PATENT DOCUMENTS

| | | | |
|---|---|---|---|
| 4,348,471 | 9/1982 | Shelnut et al. | 430/191 |
| 4,350,753 | 9/1982 | Shelnut et al. | 430/191 |
| 4,923,781 | 5/1990 | Fujikara et al. | 430/924 |
| 5,008,362 | 4/1991 | Wilharm et al. | 430/192 |
| 5,064,741 | 11/1991 | Koike et al. | 430/191 |
| 5,173,389 | 12/1992 | Uenishi et al. | 430/165 |

FOREIGN PATENT DOCUMENTS 2231247  1/1973  Fed. Rep. of Germany ...... 430/191

Primary Examiner—Charles L. Bowers, Jr.
Assistant Examiner—Christopher G. Young
Attorney, Agent, or Firm—Sughrue, Mion, Zinn, Macpeak & Seas

[57] ABSTRACT

A composition, useful for its excellent resolution, sensitivity, development properties, and heat resistance, having an alkali soluble resin and a quinonediazide compound as essential ingredients, and further containing at least one polyhydroxy compound represented by the following formula (I) or (II):

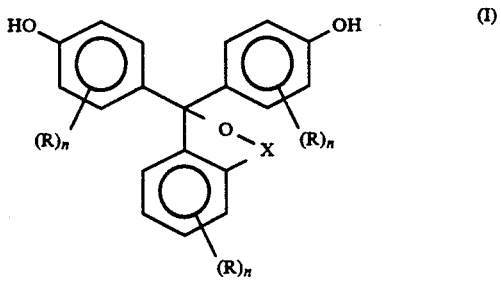

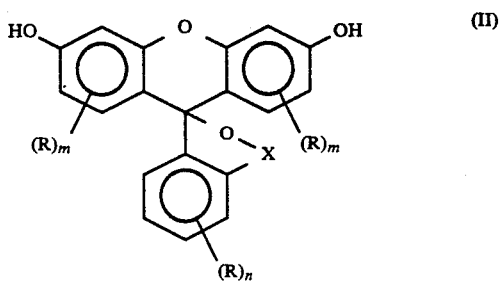

wherein R's, which may be the same or different, each represents a hydrogen atom, a halogen atom, a hydroxyl group, an alkyl group, an alkoxy group or —CH$_2$N—(—CH$_2$COOH)$_2$; X represents a —C(=O)— group or an —SO$_2$— group; m is an integer of 1 to 3; and n is an integer of 1 to 4.

6 Claims, No Drawings

POSITIVE QUINONE DIAZIDE PHOTORESIST COMPOSITION CONTAINING SELECT POLYHYDROXY ADDITIVE

FIELD OF THE INVENTION

The present invention relates to a positive type photoresist composition sensitive to radiation. More particularly, the present invention relates to a photoresist composition for fine work which provides high resolution and sensitivity and an excellent pattern sectional shape.

The positive type photoresist of the present invention is coated on a substrate such as a semiconductor wafer, glass, ceramic and metal by a spin coating method or roller coating method to a thickness of about 0.5 to 3 μm. The coated material is then heated and dried. A circuit pattern or the like is imagewise formed in the material through an exposure mask by irradiation with ultraviolet rays. The material is then subjected to development to obtain a positive image. Subsequently, the positive image is used as a mask to effect patterned etching on a substrate. Typical applications of positive type photoresist are production of semiconductors such as IC, production of circuit board such as liquid crystal and thermal head, and photofabrication.

BACKGROUND OF THE INVENTION

As positive type photoresist compositions there are normally used compositions comprising an alkali-soluble resin and a naphthoquinonediazide compound as a light-sensitive material. Examples of such compositions include novolak type phenol resin/naphthoquinonediazide-substituted compound as disclosed in U.S. Pat. Nos. 3,666,473, 4,115,128 and 4,173,470. Most typical examples of such compositions include novolak resin made of cresol-formaldehyde/trihydroxybenzophenone-1,2-naphthoquinonediazidosulfonic ester" as disclosed in L. F. Thompson, *Introduction to Microlithography* No.219, pages 112–121, published by ACS.

As a binder, novolak resins can be dissolved in an alkaline aqueous solutions without swelling. The novolak resin can also exhibit a high resistance particularly to plasma etching when an image thus produced is used as a mask for etching. Thus, novolak resins are particularly useful in this application. As a light-sensitive material, a naphthoquinonediazide compound itself serves as a dissolution inhibitor for reducing the alkali solubility of novolak resins but is peculiar in that it undergoes decomposition upon irradiation with light to produce an alkali-soluble substance which rather enhances the alkali solubility of novolak resin. Because of the great change in properties caused by irradiation with light, the naphthoquinonediazide compound is particularly useful as the light-sensitive material for a positive type photoresist.

From such a perspective, many positive type photoresists comprising novolak resin and naphthoquinonediazide light-sensitive material have heretofore been developed and put to practical use. These positive type photoresists have attained sufficient results in forming lines of a width of as small as 1.5 to 2 μm.

However, integrated circuits have further increased degree of integration. In the production of semiconductor boards such as for SLSI, it has been required to form very fine patterns of 1 μm or less side. In such application high sensitivity photoresists are desired from the viewpoints of particularly high resolution, high precision in reproducing patterns to exactly copying the shape of exposure mask and high productivity.

It is a recent tendency that the etching process is switched from wet etching processe to dry etching process to improve resolution and enhance the degree of integration in integrated circuits. However, since the dry etching process is subjected to a rise in the temperature of the resist, the resist to be used in this process is required to exhibit a high heat resistance to avoid heat deformation.

Examples of approaches for improving the heat resistance of the resist include the use of a resin free of components with a weight-average molecular weight of 2,000 or less as disclosed in JP-A-60-97347 (the term "JP-A" as used herein means an "unexamined published Japanese patent application") and the use of resin wherein the total content of monomers, dimers and trimers is 10% by weight or less as disclosed in JP-A-60-189739.

However, the use of the above mentioned resin free of or having a reduced amount of low molecular weight components is disadvantageous in that it normally causes a reduction in sensitivity, lowering the throughput in the production of devices.

It has been attempted to improve the sensitivity or developability of a resist composition by incorporating specified compounds to the resist composition. For example, U.S. Pat. No. 4,738,915 discloses a positive type photoresist composition containing trihydroxybenzophenone. The use of such a positive type photoresist composition containing trihydroxybenzophenone enables improvements in sensitivity and developability but is disadvantageous in that the incorporation of trihydroxybenzophenone causes deterioration in the heat resistance of the composition.

In approaches as disclosed in JP-A-64-44439, JP-A-1-177032, JP-A-1-280748, and JP-A-2-10350, an aromatic polyhydroxy compound other than trihydroxybenzophenone is used to provide a higher sensitivity without deteriorating the heat resistance. However, these approaches leave to be desired in the improvement in developability.

SUMMARY OF THE INVENTION

It is therefore an object of the present invention to provide a positive type photoresist composition which can provide a resist pattern having high resolution and developability and excellent heat resistance in the production of semiconductor devices.

The above and other objects of the present invention will become more apparent from the following detailed description and examples.

The inventors made extensive studies paying attention to these objects. As a result, the inventors found that the objects of the present invention can be accomplished with a positive type photoresist composition comprising an quinonediazide compound and an alkali-soluble resin as essential ingredients, characterized in that there is contained at least one polyhydroxy compound represented by formula (I) or (II):

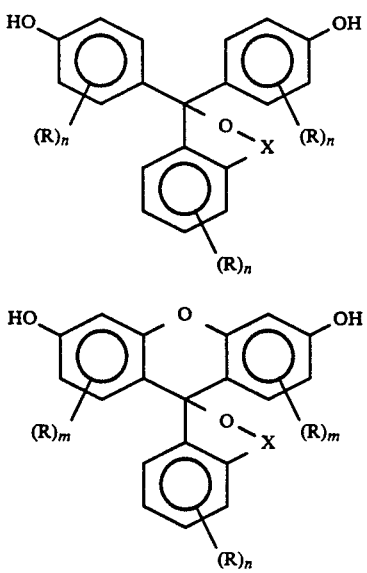

wherein R's, which may be the same or different, each represents a hydrogen atom, a halogen atom, a hydroxyl group, an alkyl group, an alkoxy group or —$CH_2N$—(—$CH_2COOH)_2$; X represents a —C(=O)— group or an —$CO_2$— group; m is an integer of 1 to 3; and n is an integer of 1 to 4.

DESCRIPTION OF THE PREFERRED EMBODIMENTS

The present invention is described in detail below.

In the above-described formulae (I) and (II), preferred examples of the halogen atoms include a chlorine atom, a bromine atom and an iodine atom. Preferred examples of the alkyl groups include alkyl groups having 1 to 4 carbon atoms such as methyl, ethyl, propyl, n-butyl, isobutyl, sec-butyl and t-butyl. Preferred examples of the alkoxy groups include alkoxy groups having 1 to 4 carbon atoms such as methoxy, ethoxy, hydroxyethoxy, propoxy, hydroxypropoxy, isopropoxy, n-butoxy, isobutoxy, sec-butoxy and t-butoxy.

Specific examples of the compounds represented by formula (I) or (II) include but are not limited to 3,3-bis(4-hydroxyphenyl)-1(3H)-isobenzofuranone, 3,3-bis[4-hydroxy-2-methyl-5-(1-methylethyl)phenyl]-1(3H)-isobenzofuranone, N,N'-{(3-oxo-1(3H)-isobenzofuranylidene)-bis[[6-hydroxy-2-methyl-5-(1-methylethyl)-3,1-phenylene]methylene]}bis[N-(carboxymethyl)-glycine, 3,3-bis(4-hydroxy-3-methylphenyl)-1(3H)-isobenzofuranone, 4,4'-(3H-2,1-benzoxathiol-3-ylridene) bisphenol S,S-dioxide, 4,4'-(3H-2,1-benzoxathiol-3-ylidene) bis[5-methyl-2-(1-methylethyl)phenol S,S-dioxide, 4,4'-(3H-2,1-benzoxathiol-3-ylidene)bis[3-methylphenol] S,S-dioxide, 4,4'-(3H-2,1-benzoxathiol-3-ylidene)bis(2-methylphenol) S,S-dioxide, 4,4'-(3H-2,1-benzoxathiol-3-ylidene)bis[2-chlorophenol] S,S-dioxide, 4,4'-(3H-2,1-benzoxathiol-3-ylidene)bis[2,6-dibromo-3-methylphenol] S,S-dioxide, 4,4'-(3H-2,1-benzoxathiol-3-ylidene)bis[2-bromo-6-chlorophenol] S,S-dioxide, 4,4'-(3H-2,1-benzoxathiol-3-ylidene)bis[2-bromo-3-methyl-6-(1-methylethyl)phenol] S,S-dioxide, 4,4'-(3H-2,1-benzoxathiol-3-ylidene)bis[2,6-dibromophenol] S,S-dioxide, 4,4'-(3H-2,1-benzoxathiol-3-ylidene)bis[2-bromophenol] S,S-dioxide, 4,4'-(3H-2,1-benzoxathiol-3-iridene)bis[3,4-dihydroxyphenyl] S,S-dioxide, 3,3-bis(3,4-dihydroxyphenyl)-1(3H)-isobenzofuranone, 3,3-bis(2,3,4-trihydroxyphenyl)-1(3H)-isobenzofuranone and 3',4'-5',6'-tetrahydroxyspiro[isobenzofuran-1(3H), 9'-xanthene]-3-one.

These compounds are obtained by condensing substituted or unsubstituted phenols and substituted or unsubstituted phthalic anhydrides or sulfophthalic anhydrides according to the method of H. L. Rohatgi et al. (*Indian J. Appl. Chem.* 21 (31, 177 (1958 )), by condensing substituted or unsubstituted o-benzoylbenzoic acids and substituted or unsubstituted phenols according to the method of P. S. Makhloga et al. (*J. Inst. Chem.* 55 (5), 209 (1983 )), compounds are also provided to the market as pH indicators.

These polyhydroxy compounds can be used singly or in combination.

The proportion of the polyhydroxy compound to the quinonediazide compound is normally in the range of about 150 parts by weight or less, preferably about 5 to about 100 parts by weight per 100 parts by weight of quinonediazide compound. If this value falls below about 5 parts by weight, a substantial effect of improving the sensitivity cannot be provided. If this value exceeds about 150 parts by weight, the percent film remaining is remarkably lowered.

Examples of alkali-soluble resin to be used in the present invention include novolak resin, acetone-pyrogallol resin, polyhydroxystyrene, and derivatives thereof.

Particularly preferred among these compounds are novolak resin. Such a novolak resin can be obtained by addition condensation of predetermined monomers as main components with aldehydes in the presence of an acidic catalyst.

As such predetermined monomers there can be used, singly, or in admixture, phenol; cresols such as m-cresol, p-cresol and o-cresol; xylenols such as 2,5-xylenol, 3,5-xylenol, 3,4-xylenol and 2,3-xylenol; alkylphenols such as m-ethylphenol, p-ethylphenol, o-ethylphenol and p-t-butylphenol; alkoxyphenols such as p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol and p-butoxyphenol; bisalkylphenols such as 2-methyl-4-isopropylphenol; and hydroxyaromatic compounds such as m-chlorophenol, p-chlorophenol, o-chlorophenol, dihydroxybiphenyl, bisphenol A, phenylphenol, resorcinol and naphthol. However, the present invention should not be construed as being limited thereto.

Examples of aldehydes to be used in addition condensation include formaldehyde, paraformaldehyde, acetaldehyde, propylaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaidehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde and acetal compounds thereof such as chloroacetaldehydediethylacetal. Among these compounds, formaldehyde can be preferably used.

These aldehydes are used singly or in combination.

Examples of acidic catalysts to be used in the addition condensation include hydrochloric acid, sulfuric acid, formic acid, acetic acid, and oxalic acid.

The weight average molecular weight of the novolak resin thus obtained is preferably in the range of about 2,000 to about 30,000, particularly about 6,000 to about 20,000. If this value falls below about 2,000, the loss of film on unexposed portions after development becomes too great. If this value exceeds about 30,000, the development speed is too low. The particularly preferred molecular weight range is from about 6,000 to about 20,000.

The weight average molecular weight as specified herein is represented as calcuated in terms of polystyrene determined gel permeation chromatography.

The light-sensitive material to be used in the present invention can comprise a compound obtained by esterification of a polyhydroxy compound set forth below with 1,2-naphthoquinonediazido-5-(and/or -4-)sulfonyl chloride.

Examples of such a polyhydroxy compound include polyhydroxybenzophenones such as 2,3,4-trihydroxybenzophenone, 2,4,4'-trihydroxybenzophenone, 2,4,6-trihydroxybenzophenone, 2,3,4-trihydroxy-2'-methylbenzophenone, 2,3,4,4'-tetrahydroxybenzophenone, 2,2',4,4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,6,3',4',5'-hexahydroxybenzophenone, and 2,3,4,3',4',5'-hexahydroxybenzophenone; polyhydroxyphenylalkylketones such as 2,3,4-trihydroxyacetophenone, 2,3,4-trihydroxyphenylpentylketone and 2,3,4-trihydroxyphenylhexylketone; bis((poly)hydroxy-phenyl)alkanes such as bis (2,4-dihydroxyphenyl)methane, bis(2,3,4-trihydroxyphenyl)methane, bis(2,4-dihydroxyphenyl)propane-1, bis(2,3,4-trihydroxyphenyl)propane-1 and nordihydroguaiaretic acid; polyhydroxybenzoic esters such as 3,4,5-trihydroxybenzoic propyl, 2,3,4-trihydroxybenzoic phenyl and 3,4,5-trihydroxybenzoic phenyl; bis (polyhydroxybenzoyl)alkanes or bis (polyhydroxybenzoyl)aryls such as bis(2,3,4-trihydroxybenzoyl)methane, his(3-acetyl-4,5,6-trihydroxyphenyl)methane, bis(2,3,4-trihydroxybenzoyl)benzene and bis(2,4,6-trihydroxybenzoyl)benzene; alkylene-di(-polyhydroxybenzoate) such as ethylene glycol di(3,5-dihydroxybenzoate) and ethylene glycol di(3,4,5-trihydroxybenzoate); polyhydroxybiphenyls such as 2,3,4-biphenyltriol, 3,4,5-biphenyltriol, 3,5,3',5'-biphenyltetrol, 2,4,2',4'-biphenyltetrol, 2,4,6,3',5'-biphenylpentol, 2,4,6,2',4',6'-biphenylhexol, and 2,3,4,2',3',4'-biphenylhexol; bis(polyhydroxy)sulfides such as 4,4'-thiobis(1,3-dihydroxy)benzene; bis(polyhydroxyphenyl) ethers such as 2,2',4,4'-tetrahydroxydiphenylether; bis(polyhydroxyphenyl)sulfoxides such as 2,2',4,4'-tetrahydroxydiphenylsulfoxide; bis(polyhydroxyphenyl)sulfones such as 2,2',4,4'-tetrahydroxydiphenylsulfone; polyhydroxytriphenylmethanes such as 4,4',3",4"-tetrahydroxy-3,5,3',5'-tetramethyltriphenylmethane, 4,4',2"3",4"-pentahydroxy-3,5,3',5'-tetramethyltriphenylmethane, 2,3,4,2',3',4'-hexahydroxy-5,5'-diacetyltriphenylmethane, 2,3,4,2',3',4',3",4"-octahydroxy-5,5'-diacetyltriphenylmethane and 2,4,6,2',4',6'-hexahydroxy-5,5'-dipropionyltriphenylmethane; polyhydroxyspirobiindanes such as 3,3,3',3'-tetramethyl-1,1'-spirobiindane-5,6,5',6'-tetrol 3 3 3',3'-tetramethyl-1,1'-spirobiindane-5,6,7,5',6',7'-hexo 3,3,3',3'-tetramethyl-1,1' -spirobiindane-4,5,6,4',5',6'-hexol; and 3,3,3',3'-tetramethyl-1,1'-spirobiindane-4,5,6,5',6',7'-hexol; polyhydroxyphthalides such as 3,3-bis(3,4-dihydroxyphenyl) phthalide, 3,3-bis(2,3,4-trihydroxyphenyl) phthalide and 3',4',5',6'-tetrahydroxyspiro[phthalide-3,9'-xanthene]; and flayoho dyes such as morin, quersetin and rutin.

Alternatively, oligomers of phenol resin such as novolak resin can be used.

These light-sensitive materials obtained by esterification of polyhydroxy compound with naphthoquinonediazide can be used singly or in combination.

The proportion of the light-sensitive material to the alkali-soluble resin is normally in the range of about 5 to about 100 parts by weight, preferably about 10 to about 50 parts by weight per 100 parts by weight of resin. If this value falls below about 5 parts by weight, the percent film remaining is remarkably lowered. If this value exceeds about 100 parts by weight, the sensitivity and the solubility in solvent are lowered.

The composition of the present invention can further comprise other polyhydroxy compounds to accelerate solubility in the developer. Preferred examples of such polyhydroxy compounds include phenols, resorcin, phloroglucin, 2,3,4-trihydroxybenzophenone, 2,3,4,4'-tetrahydroxybenzophenone, 2,3,4,3',4',5'-hexahydroxybenzophenone, acetone-pyrogallol condensate resins, phloroglucide, 2,4,2',4'-biphenyltetrol, 4,4'-thiobis(1,3-dihydroxy)benzene, 2,2',4 4'-tetrahydroxydiphenylether, 2,2',4,4'-tetrahydroxydiphenyl sulfoxide and 2,2',4,4'-tetrahydroxydiphenylsulfone Such a polyhydroxy compound can be used in an amount of about 50 parts by weight or less, preferably about 30 parts by weight or less per 100 parts by weight of polyhydroxy compound of the present invention.

Examples of solvent in which the light-sensitive material and the alkali-soluble novolak resin can be dissolved include ketones such as methyl ethyl ketone and cyclohexanone; ketoethers such as 4-ethoxy-2-butanone and 4-methoxy-4-methyl-2-pentanone; alcohol ethers such as ethylene glycol monomethyl ether and ethylene glycol monoethyl ether; ethers such as dioxane and ethylene glycol dimethyl ether; cellosolve esters such as methyl cellosolve acetate and ethyl cellosolve acetate; aliphatic esters such as butyl acetate, methyl lactate and ethyl lactate; halogenated hydrocarbons such as 1,1,2-trichloroethylene; and high polar solvents such as dimethylacetamide, N-methylpyrrolidone, dimethylformamide and dimethyl sulfoxide. These solvents can be used singly or in combination with each other.

The positive type photoresist composition of the present invention can comprise surface active agents to further improve coating properties such as striation.

Examples of such surface active agents include nonionic surface active agents such as polyoxyethylene alkyl ionic surface active agents such as polyoxyethylene alkyl ethers (e.g., polyoxyethylene lauryl ether, polyoxyethylene stearyl ether, polyoxyethylene cetyl ether, polyoxyethylene oleyl ether); polyoxyethylene alkylallyl ethers (e.g., polyoxyethylene octyl phenol ether and polyoxyethylene nonyl phenol ether); polyoxyethylene-polyoxypropylene block copolymers; sorbitan aliphatic esters (e.g., sorbitan monolaurate, sorbitan monopalmitate, sorbitan monostearate, sorbitan monooleate, sorbitan trioleate and sorbitan tristearate); and polyoxyethylene sorbitan aliphatic esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate); fluorine-containing surface active agents such as F TOP EF301, EF303 and EF352 (available from Shinakita Kasei K. K.), Megafac F171, F173 (available from Dainippon Ink and Chemicals Incorporated), Furorad FC430, FC431 (available from Sumitomo 3M) and Asahi Guard AG710, Surflon S-382, SC101, SC102, SC103, SC104, SC105 and SC106 (available from Asahi Glass Company Limited); Organosiloxane Polymer KP341 (available from Shin-etsu Chemical Industry Co., Ltd.); and acrylic or methacrylic (co)polymer Polyflow No. 75 and No. 95 (available from by Kyoeisha Yushikagaku Kogyo Co., Ltd.). The content of such a surface active agent is normally in the range of about 2 parts by weight or less, preferably about 1 part by weight or less per 100 parts by weight of alkali of the present invention.

These surface active agent can be used singly or in combination.

Examples of developer for the positive type photoresist composition of the present invention include aqueous solutions of alkalis such as inorganic alkali (e.g., sodium hydroxide, potassium hydroxide, sodium carbonate, sodium silicate, sodium metasilicate, aqueous ammonia); primary amines (e.g., ethylamine and n-propylamine); secondary amines (e.g., diethylamine, di-n-butylamine); tertiary amines (e.g., triethylamine, methyldiethylamine); alcoholamines (e.g., dimethylethanolamine, triethanolamine); quaternary ammonium salts (e.g., tetramethylammonium hydroxide, tetraethylammonium hydroxide); and cyclic amines (e.g., pyrrole, piperidine). These aqueous solutions of alkalis may further contain alcohol and surface active agents in proper amounts.

The positive type photoresist composition of the present invention can comprise a dye, a plasticizer, and an adhesive aid as necessary. Specific examples of such additives include dyes such as methyl violet, crystal violet and malachite green; plasticizers such as stearic acid, acetal resin, phenoxy resin, and alkyd resins; and adhesive aids such as hexamethyl disilazane, and chloromethyl silane.

The above mentioned positive type photoresist composition can be coated by a proper coating means such as spinner and coater on a substrate as commonly used in the spinner and coater on a substrate as commonly used in the production of precision integrated circuit elements (e.g., silicon/silicon dioxide-coated substrate), exposed to light through a predetermined mask, and then developed to obtain an excellent resist.

The present invention will be further described hereinafter, but the present invention should not be construed as being limited thereto. The unit % indicates percent by weight unless otherwise defined.

EXAMPLES 1-8 & COMPARATIVE EXAMPLES 1-5

(1) Synthesis of Novolak Resin (a)

40 g of m-cresol, 60 g of p-cresol, 54.0 g of formalin (a 37% aqueous solution of formaldehyde) and 0.05 g of oxalic acid were charged into a three-necked flask. The reaction system was then heated with stirring to a temperature of 100° C. where it was then allowed to undergo reaction. After the reaction was completed, the reaction system was cooled to room temperature where it was then subjected to reduced pressure of 30 mmHg.

The reaction system was then gradually heated to a temperature of 150° C. to remove and unreacted monomers therefrom. The resulting novolak resin exhibited an average molecular weight of 7,900 as calculated in terms of polystyrene.

(2) Synthesis of Novolak Resin (b)

A cresol novolak resin (molecular weight: 9,400 as calculated in terms of polystyrene) was prepared in the same manner as in the foregoing paragraph (1) except that 50% by weight of metacresol, 50% by weight of paracresol and formalin were used. The cresol vonolak resin thus obtained was then subjected to separation of low molecular components in accordance with the method as disclosed in Masayoshi Kinoshita and Takayuki Otsu, *Experimental Synthesis of High Molecular Compounds*, Kagaku Dojin, page 32, 1973, to obtain a cresol novolak resin with a molecular weight of 10,060 as calculated in terms of polystyrene.

(3) Synthesis of Light-Sensitive Material A 11.5 g of 2,3,4-trihydroxybenzophenone, 30.2 g of 1,2-naphthoquinonediazido-5-sulfonyl chloride and 300 ml of acetone were charged into a three-necked flask, in which they were uniformly dissolved. A mixture of 11.4 g of triethylamine and 50 ml of acetone was gradually added dropwise to the reaction system at a temperature of 25° C. for 3 hours. The reaction mixture solution was poured into 1,500 ml of a 1% aqueous hydrochloric acid. The resulting precipitate was filtered off, washed with water, and then dried at a temperature of 40° C. to obtain 29.8 g of 1,2-naphthoquinonediazido-5-sulfonic ester of 2,3,4-trihydroxybenzophenone.

(4) Synthesis of Light-Sensitive Material B 12.3 g of 2,3,4,4'-tetrahydroxybenzophenone, 40.3 g of 1,2-naphthoquinonediazido-5-sulfonyl chloride and 300 ml of acetone were charged into a three-necked flask, in which ethylamine and 50 ml of acetone was gradually added dropwise to the reaction system at a temperature of 25° C. for 3 hours. The reaction mixture was poured into 1,500 ml of a 1% aqueous hydrochloric acid. The resulting precipitate was filtered off, washed with water, and then tried at a temperature of 40° C. to obtain 39.7 g of 1,2-naphthoquinonediazido-5-sulfonic ester of 2,3,4,4'-tetrahydroxybenzophenone.

(5) Preparation and Evaluation of Positive Type Photoresist Compositions

Cresol novolak resins (a) and (b) obtained in the foregoing paragraphs (1) and (2) and light-sensitive materials (A) and (B) obtained in the foregoing paragraphs (3) and (4) and additives (1) to (8) indicated in Table 1 were dissolved in 15 g of ethylcellosolve acetate in amounts indicated in Table 2, respectively. These solutions were then filtered through a 0.2-μm microfilter. The photoresist compositions were each coated by a spinner on a silicon wafer, and then dried at a temperature of 90° C. in an atmosphere of nitrogen in a convection oven for 30 minutes to obtain 1.2-μm thick resist films. These resist films were each exposed to light through a test chart mask by means of a reduced projection exposure apparatus FPA-1550 available from Canon Inc., developed with a 2.38% aqueous solution of tetramethylammonium hydroxide for 1 minute, washed with water for 30 seconds, and then dried.

The resulting resist patterns on the silicon wafers were then evaluated under a scanning electron microscope. The results are set forth in Table 3.

The sensitivity is defined as reciprocal of the exposure at which a 0.70-μm mask pattern is reproduced. This value is represented relative to that of Comparative Example 1.

The percent film remaining is represented by percent ratio of presence of film before development to that after development.

The resolution is represented by threshold resolution at the exposure at which a 0.70-μm mask pattern is reproduced.

The heat resistance is represented by the highest temperature at which a resist pattern on the silicon wafer shows no deformation when the wafer is baked in a convection oven for 30 minutes.

The shape of the resist is represented by an angle ($\theta$) formed by the wall surface of the resist and the plane of the silicon wafer in a 0.70-μm thick resist pattern section.

For the evaluation of developability, E indicates an excellent level in which no surface layer peeling and film residue are observed, P indicates a poor level in which much surface layer peeling and film residue are observed, and F indicates a fair level in which slight surface layer peeling and film residue is observed.

The results which are set forth in Table 3, show that the resists comprising the additives (a) to (d) of the present invention exhibit excellent sensitivity, percent film remaining, resolution, heat resistance, resist shape, and resolution.

TABLE 1

Additives Used for Preparation of Compositions

| No. | Additive |
|---|---|
| 1 | 3,3-Bis(4-hydroxyphenyl)-1(3H)-isobenzofuranone |
| 2 | 4,4'-(3H-2,1-Benzoxathiol-3-ylidene)bisphenol S,S'-dioxide |
| 3 | 3,3-Bis[4-hydroxy-2-methyl-5-(1-methylethyl)phenyl]-1(3H)-isobenzofuranone |
| 4 | 3',4',5',6'-Tetrahydroxyspiro[isobenzofuranone-1(3H),9'-xanthene]-3-one |
| 5 | 2,3,4-trihydroxybenzophenone |
| 6 | 2,3,4,4'-tetrahydroxybenzophenone |
| 7 | 2,3,4,3',4',5'-hexahydroxybenzophenone |
| 8 | 2,2,4,4'-tetrahydroxydiphenyl sulfide |

TABLE 2

Composition of Resist

| | Novolak Resin | | Photosensitive Material | | Additive | |
|---|---|---|---|---|---|---|
| | Kind | Amount Added (g) | Kind | Amount Added (g) | Kind | Amount Added (g) |
| Example 1 | a | 5.0 | A | 1.25 | 1 | 0.38 |
| Example 2 | a | 5.0 | A | 1.25 | 2 | 0.31 |
| Example 3 | a | 5.0 | B | 1.25 | 3 | 0.38 |
| Example 4 | a | 5.0 | B | 1.25 | 4 | 0.31 |
| Example 5 | a | 5.0 | B | 1.35 | 1 | 0.41 |
| Example 6 | b | 5.0 | A | 1.40 | 2 | 0.41 |
| Example 7 | b | 5.0 | B | 1.40 | 3 | 0.41 |
| Example 8 | b | 5.0 | B | 1.50 | 4 | 0.45 |
| Comparative Example 1 | a | 5.0 | A | 1.25 | — | — |
| Comparative Example 2 | a | 5.0 | A | 1.25 | 5 | 0.38 |
| Comparative Example 3 | a | 5.0 | B | 1.25 | 6 | 0.38 |
| Comparative Example 4 | b | 5.0 | B | 1.35 | 7 | 0.41 |
| Comparative Example 5 | b | 5.0 | A | 1.50 | 8 | 0.45 |

TABLE 3

| | Results of Evaluation | | | | | |
|---|---|---|---|---|---|---|
| | Relative Sensitivity | Film Remaining (%) | Resolution (μm) | Heat Resistance (°C.) | Shape of Resist ($\theta$) | Developability |
| Example 1 | 1.2 | 99 | 0.50 | 135 | 86 | E |
| Example 2 | 1.3 | 98 | 0.50 | 135 | 86 | E |
| Example 3 | 1.3 | 99 | 0.50 | 135 | 87 | E |
| Example 4 | 1.2 | 99 | 0.50 | 135 | 88 | E |
| Example 5 | 1.3 | 98 | 0.50 | 135 | 86 | E |
| Example 6 | 1.2 | 99 | 0.50 | 140 | 87 | E |
| Example 7 | 1.2 | 99 | 0.50 | 145 | 87 | E |
| Example 8 | 1.3 | 98 | 0.50 | 145 | 86 | E |
| Comparative Example 1 | 1.0 | 98 | 0.52 | 135 | 85 | P |
| Comparative Example 2 | 1.1 | 95 | 0.52 | 125 | 82 | E |
| Comparative Example 3 | 1.1 | 97 | 0.52 | 130 | 83 | F |
| Comparative Example 4 | 1.0 | 95 | 0.55 | 135 | 82 | F |
| Comparative Example 5 | 0.9 | 96 | 0.55 | 135 | 82 | F |

As apparent from these results, the resists of the present invention using additives 1 to 4 are excellent in sensitivity, resolution, heat resistance, shape of the resist and development properties.

The positive photoresist compositions of the present invention are suitable for fine work.

While the invention has been described in detail and with reference to specific embodiments, it will be apparent to one skilled in the art that various changes and modifications can be made without departing from the spirit and scope.

What is claimed is:

1. A positive photoresist composition consisting essentially of an admixture of:
   (a) an alkali soluble resin,
   (b) a quinonediazide compound, and
   (c) at least one polyhydroxy compound represented by general formula (II):

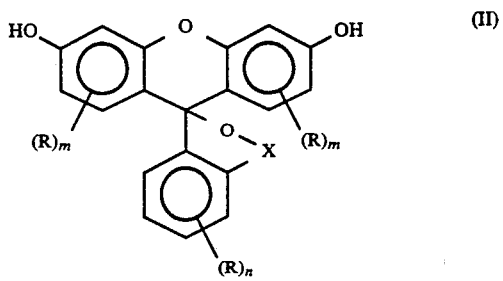

wherein each R, which may be the same or different, represents a hydrogen atom, a halogen atom, a hydroxyl group, an alkyl group, an alkoxy group or —CH$_2$N—(—CH$_2$COOH)$_2$; X represents a —C(=O)— group or an —SO$_2$— group; m is an integer of 1 to 3; and n is an integer of 1 to 4;

said quinonediazide compound being present in an amount of 5 to 100 parts by weight per 100 parts by weight of said alkali soluble resin; and said at least one polyhydroxy compound being present in an amount of 5 to 150 parts by weight per 100 parts by weight of said quinonediazide compound.

2. The composition of claim 1, wherein each R represents chlorine, bromine, iodine, an alkyl group having 1 to 4 carbon atoms or an alkoxy group having 1 to 4 carbon atoms.

3. The composition of claim 1, wherein said at least one polyhydroxy compound is present in an amount of 5 to 100 parts by weight per 100 parts by weight of the quinonediazide compound.

4. The composition of claim 1, wherein the alkali soluble resin is a novolak resin.

5. The composition of claim 4, wherein the weight average molecular weight of the novolak resin is from 2,000 to 30,000.

6. The composition of claim 1, wherein said quinonediazide compound is present in an amount of 10 to 50 parts by weight per 100 parts by weight of alkali soluble resin.

* * * * *